(12) United States Patent
Hirler et al.

(10) Patent No.: US 9,246,410 B2
(45) Date of Patent: Jan. 26, 2016

(54) INTEGRATED POWER SEMICONDUCTOR COMPONENT, PRODUCTION METHOD AND CHOPPER CIRCUIT COMPRISING INTEGRATED SEMICONDUCTOR COMPONENT

(71) Applicant: Infineon Technologies Austria AG, Villach (AT)

(72) Inventors: Franz Hirler, Isen (DE); Anton Mauder, Kolbermoor (DE); Andreas Meiser, Sauerlach (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 383 days.

(21) Appl. No.: 13/916,732

(22) Filed: Jun. 13, 2013

(65) Prior Publication Data
US 2013/0336033 A1 Dec. 19, 2013

(30) Foreign Application Priority Data

Jun. 14, 2012 (DE) .......................... 10 2012 105 162

(51) Int. Cl.
*H01L 27/088* (2006.01)
*H01L 27/02* (2006.01)
(Continued)

(52) U.S. Cl.
CPC ........... *H02M 7/539* (2013.01); *H01L 27/0629* (2013.01); *H01L 29/7397* (2013.01); *H01L 29/7804* (2013.01); *H01L 29/7813* (2013.01); *H01L 29/861* (2013.01);
(Continued)

(58) Field of Classification Search
CPC .............. H01L 27/0629; H01L 29/861; H01L 29/7397; H01L 29/7813; H01L 29/7804; H02M 7/539; H02M 3/155; Y10T 307/25
USPC ......... 257/329, 330, 331, 334, 341, 355, 368, 257/376, 500, E27.016, E27.041; 307/11; 327/108, 374; 363/124
See application file for complete search history.

(56) References Cited

U.S. PATENT DOCUMENTS 6,215,289 B1 * 4/2001 Simonnet .................. G05F 3/18
323/282
2006/0273346 A1 12/2006 Pfirsch
(Continued)

FOREIGN PATENT DOCUMENTS

| CN | 101136368 A | 3/2008 |
|---|---|---|
| DE | 102005023668 B3 | 11/2006 |
| DE | 102006050338 A1 | 4/2008 |
| DE | 102011081426 A1 | 3/2012 |

*Primary Examiner* — Dao H Nguyen
(74) *Attorney, Agent, or Firm* — Murphy, Bilak & Homiller, PLLC

(57) ABSTRACT

A monolithically integrated power semiconductor component includes a semiconductor body having first and second regions each extending from a first surface of the semiconductor body to a second opposing surface of the body. A power field effect transistor structure formed in the first region has a first load terminal on the first surface and a second load terminal on the second surface. A power diode formed in the second region has a first load terminal on the first surface and a second load terminal on the second surface. The second load terminals of the power field effect transistor structure and power diode are formed by a common load terminal. An edge termination structure is arranged adjacent to the first surface and in a horizontal direction between the first load terminal of the power field effect transistor structure and the first load terminal of the power diode.

20 Claims, 11 Drawing Sheets

(51) Int. Cl.
*H01L 29/78* (2006.01)
*H02M 7/539* (2006.01)
*H01L 27/06* (2006.01)
*H01L 29/739* (2006.01)
*H01L 29/861* (2006.01)
*H02M 3/155* (2006.01)
*H01L 29/32* (2006.01)
*H01L 29/40* (2006.01)
*H01L 29/08* (2006.01)

(52) U.S. Cl.
CPC ............ *H01L 29/0878* (2013.01); *H01L 29/32* (2013.01); *H01L 29/404* (2013.01); *H02M 3/155* (2013.01); *Y10T 307/25* (2015.04)

(56) References Cited

U.S. PATENT DOCUMENTS

| | | | |
|---|---|---|---|
| 2009/0200607 A1* | 8/2009 | Matsuura | H01L 29/41741 257/332 |
| 2009/0273027 A1* | 11/2009 | Adan | H01L 21/823828 257/334 |
| 2014/0042535 A1* | 2/2014 | Darwish | H01L 29/4236 257/334 |
| 2014/0374773 A1* | 12/2014 | Ryu | H01L 27/098 257/77 |
| 2015/0084125 A1* | 3/2015 | Pala | H01L 21/26506 257/334 |

* cited by examiner

INTEGRATED POWER SEMICONDUCTOR COMPONENT, PRODUCTION METHOD AND CHOPPER CIRCUIT COMPRISING INTEGRATED SEMICONDUCTOR COMPONENT

PRIORITY CLAIM

This application claims priority to German Patent Application No. 10 2012 105 162.3, filed on 14 Jun. 2012, the content of said German application incorporated herein by reference in its entirety.

TECHNICAL FIELD

The present invention relates to an integrated power semiconductor component, particularly a monolithically integrated power semiconductor component having a power field effect transistor and a power diode, a method for producing such an integrated semiconductor component, and a chopper circuit including such an integrated semiconductor component.

BACKGROUND

In bridge circuits, a combination of an IGBT (insulated gate bipolar transistor) and an antiparallel freewheeling diode is often not necessarily required. In many bridge circuits, e.g. in bridge circuits for driving switched reluctance motors (also referred to herein as SR motors), stepper motors or in lighting applications, a series circuit formed by a MOSFET (metal oxide semiconductor field effect transistor) or an IGBT with a diode proves to be completely sufficient for the function. In order to realize such a circuit, discrete IGBTs and diodes have been typically used, i.e. the circuit is constructed from a relatively high number of individual components. This leads to increased costs, in particular in the case of driving systems for motors having a high number of poles and correspondingly a large number of required chopper circuits, since additional assembly work becomes necessary for each component.

SUMMARY

In accordance with one embodiment, a monolithically integrated power semiconductor component is provided. The monolithically integrated power semiconductor component comprises a semiconductor body having a first region and a second region. The first region and the second region extend in each case from a first surface of the semiconductor body as far as a second surface of the semiconductor body, the second surface being opposite the first surface. A normal direction with respect to the first surface defines a vertical direction. The monolithically integrated power semiconductor component furthermore comprises a power field effect transistor structure formed in the first region, a power diode formed in the second region, and at least one edge termination structure. The power field effect transistor structure has a first load terminal on the first surface of the semiconductor body, and a second load terminal on the second surface of the semiconductor body. The power diode has a first load terminal on the first surface of the semiconductor body, and a second load terminal on the second surface of the semiconductor body. The second load terminal of the power field effect transistor structure and the second load terminal of the power diode ($D_{H1}$) are formed by a common load terminal. The at least one edge termination structure is arranged adjacent to the first surface and in a horizontal direction between the first load terminal of the power field effect transistor structure and the first load terminal of the power diode.

In accordance with one embodiment, a chopper circuit for driving a load is provided. The chopper circuit comprises a first voltage terminal, a second voltage terminal, a terminal for the load, and a monolithically integrated power semiconductor component comprising a semiconductor body. The semiconductor body has a first region and a second region, which extend in each case from a first surface of the semiconductor body as far as a second surface of the semiconductor body, the second surface being opposite the first surface. A normal direction with respect to the first surface defines a vertical direction. A power field effect transistor structure formed in the first region has a first load terminal on the first surface of the semiconductor body, and a second load terminal on the second surface of the semiconductor body. A power diode formed in the second region has a first load terminal on the first surface of the semiconductor body, and a second load terminal on the second surface of the semiconductor body. The second load terminal of the power field effect transistor structure and the second load terminal of the power diode are formed by a common load terminal. At least one edge termination structure is arranged adjacent to the first surface and in a horizontal direction between the first load terminal of the power field effect transistor structure and the first load terminal of the power diode. The terminal for the load is connected to the common load terminal with low impedance. The first voltage terminal is connected to the first load terminal of the power field effect transistor structure with low impedance. The second voltage terminal is connected to the first load terminal of the power diode with low impedance.

In accordance with a further embodiment, a chopper circuit for driving a load is provided. The chopper circuit comprises a first voltage terminal, a second voltage terminal, at least one terminal for the load and at least one integrated semiconductor power component. The at least one integrated semiconductor power component comprises a common load terminal, which is connected to the first voltage terminal with low impedance, a vertical diode structure comprising an anode zone, which adjoins the common load terminal, and a cathode terminal, which is connected to the second voltage terminal with low impedance, and a vertical MOSFET structure or a vertical IGBT structure. The vertical MOSFET structure comprises a drain zone, which adjoins the common load terminal, and a source zone, which is connected to the first voltage terminal with low impedance. The vertical IGBT structure comprises a collector zone, which adjoins the common load terminal, and an emitter zone, which is connected to the first voltage terminal with low impedance.

In accordance with a further embodiment, a method for producing an integrated semiconductor component is provided. The method comprises providing a semiconductor body having a top side and an opposite underside, wherein the semiconductor body comprises a first semiconductor layer of a first conductivity type. A field effect structure and a first load electrode, which makes contact with the field effect structure, are formed from the top side in a first region of the semiconductor body. The channel type of the field effect structure corresponds to the first conductivity type. A contact structure to the first semiconductor layer is formed from the top side in a second region of the semiconductor body. The contact structure comprises a further load electrode. At least one edge termination structure is formed between the first load electrode and the further load electrode. The semiconductor body is thinned at the underside in order to produce a rear side. A vertical pn junction is formed at least in the second region. A common load electrode is formed on the rear side in the first region and in the second region.

Further advantageous configurations, details, aspects and features of the present invention are evident from the dependent claims, the description and also the accompanying drawings.

BRIEF DESCRIPTION OF THE DRAWINGS

The drawings illustrate embodiments and together with the description serve to elucidate principles of embodiments. The drawings are not necessarily scaled and serve for illustration purposes. The elements in the drawings are not necessarily true to scale relative to one another. For the sake of clarity, the same elements or production steps in the different drawings have been designated by the same reference signs, unless indicated otherwise. In the figures.

DETAILED DESCRIPTION

Figure 1B:
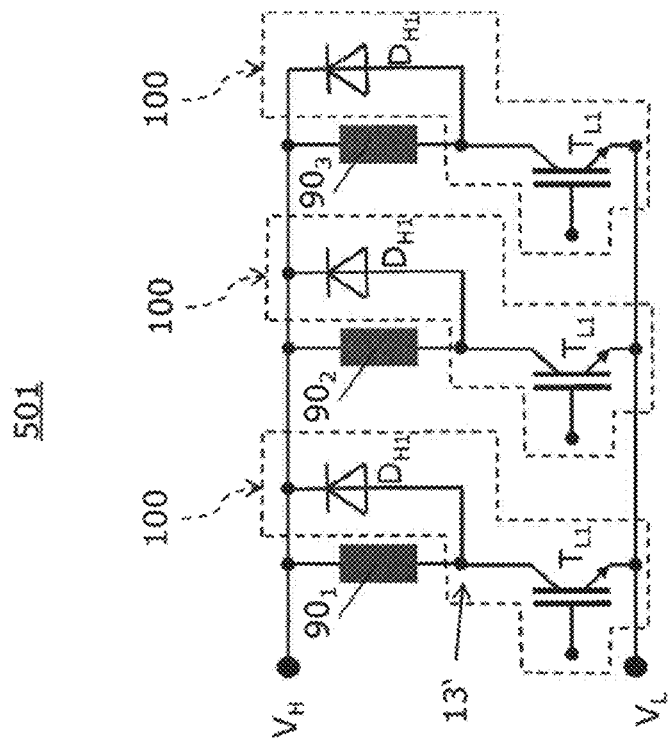
FIG. 1B shows a circuit diagram of a chopper circuit for driving a load in accordance with a further embodiment.

In the following detailed description, reference is made to the accompanying drawings, which form a part thereof and which show as illustration specific embodiments in which the invention can be practiced. In this regard, terms of directional terminology such as, for instance, "top side", "underside", "front side", "rear side", "front", "rear", etc. are used with reference to the orientation of the figure(s) described. Since components of embodiments can be positioned in a series of different orientations, the direction terminology is used for explanatory purposes and is not in any way restrictive. Other embodiments can be used and structural or logical changes can be made, without departing from the scope of protection of the present invention. Therefore, the following detailed description should not be understood in a restrictive sense.

Reference will now be made in detail to different embodiments, one or more examples of which are illustrated in the figures. Each example serves for elucidation and is not intended to constitute any restriction of the invention. By way of example, features described or illustrated as part of one embodiment can be used with or in conjunction with other embodiments in order to result in yet another embodiment. The intention is for the present invention to include such modifications and variations. The examples are described using a specific language which should not be interpreted such that it restricts the scope of protection of the accompanying claims.

The term "horizontal" as used herein is intended to describe an orientation substantially parallel to a first or horizontal main surface of a semiconductor substrate or body. This can be, for example, the surface of a wafer or of a chip.

The term "vertical" as used herein is intended to describe an orientation substantially perpendicular to the horizontal main surface, i.e. parallel to the normal direction with respect to the horizontal main surface of the semiconductor substrate or body.

Hereinafter, n-doped is designated as a first conductivity type, while p-doped is designated as a second conductivity type. The majority charge carriers of an n-doped zone and of a p-doped zone are electrons and holes, respectively. In this specification, a negative charge type is designated as a first charge type, while a positive charge type is designated as a second charge type. Of course, the semiconductor components can also be formed with opposite dopings, such that the first conductivity type can be p-doped and the second conductivity type can be n-doped. Accordingly, the first charge type can also designate the charge type of holes. Furthermore, some figures illustrate relative doping concentrations by symbols "−" or "+" appended to the doping type. By way of example, "$n^-$" denotes a doping concentration that is less than the doping concentration of an "n"-type doping zone, while an "$n^+$"-type doping zone has a greater doping concentration than the "n"-type doping zone. However, the indication of the relative doping concentration does not mean that doping zones having the same relative doping concentration must have the same absolute doping concentration, unless indicated otherwise. By way of example, two different $n^+$-type zones can have different absolute doping concentrations. The same applies, for example, to an $n^+$-type zone and a $p^+$-type zone.

The embodiments described herein relate to integrated power semiconductor components comprising a power field effect transistor structure and a power diode, typically a pn power diode or bipolar power diode, production methods therefor, and chopper circuits comprising one or more such power semiconductor components for driving a load.

The term "chopper circuit" as used herein is intended to describe a driver circuit embodied as a bridge circuit and serving for supplying an electrical load, e.g. an electric motor or a lighting device such as a fluorescent lamp, which converts a DC voltage input voltage into an AC voltage output signal or a pulsed DC voltage output signal and in this case typically enables a pulse control (chopper control) of the load. The chopper circuit can be embodied either as a half-bridge or as a full bridge.

The term "field effect" as used herein is intended to describe the formation—mediated by an electric field—of a conductive "channel" of a first conductivity type and/or a control of the conductivity and/or of a form of the channel in a semiconductor zone of a second conductivity type typically a body zone of the second conductivity type. Based on the field effect, the electric field forms and/or controls, in the case of a MOSFET, a unipolar current path through the channel zone between a source zone of the first conductivity type in ohmic contact with a source electrode and a drift zone of the first conductivity type. The drift zone is in ohmic contact with a drain zone of the first conductivity type, which is in ohmic contact with a drain electrode. Without application of an external voltage between the gate electrode and the source electrode, the current path between the source electrode and the drain electrode through the semiconductor component in the case of normally off field effect components is interrupted or has at least a high resistance. In the case of an IGBT, an emitter zone corresponds to the source zone of the MOSFET. Moreover, in the case of an IGBT, a further pn junction is arranged between the drift zone and a collector electrode instead of the drain electrode. This further pn junction can be formed between a collector zone of the second conductivity type instead of the drain zone and the drift zone.

The term "field effect structure" as used herein is intended to describe a structure formed in a semiconductor substrate or a semiconductor component with a gate electrode and serving to form and/or shape a conductive inversion channel, also designated hereinafter as channel, in the channel zone. The gate electrode is insulated at least from the channel zone by a dielectric zone or a dielectric layer. The dielectric zone, for simplification, is also referred to herein as gate oxide, even if it does not involve an oxide, such as silicon oxide ($SiO_2$), but rather some other dielectric, such as silicon nitride ($Si_3N_4$) for instance.

The term "field plate" as used herein is intended to describe an electrode arranged adjacent to a semiconductor zone, typically a drift zone or a base zone, and insulated from the semiconductor zone and designed to extend a space charge zone in the semiconductor zone, i.e. a depleted section in the semiconductor zone, by applying a corresponding voltage, generally a positive voltage for an n-type drift zone. The terms "depleted" and "fully depleted" are intended to describe that a semiconductor zone comprises substantially no free charge carriers. Typically, insulated field plates are arranged near pn junctions formed e.g. between a drift zone and a body zone. Accordingly, the reverse voltage of the pn junction or of the semiconductor component can be increased. The dielectric layer or the dielectric zone which insulates the field plate from the drift zone is also referred to herein as a field dielectric layer, a field dielectric zone or, for simplification, as field oxide, even if it does not involve an oxide, but rather some other dielectric. Examples of dielectric materials for forming a dielectric zone or a dielectric layer between the gate electrode or a field plate and the semiconductor body or between the gate electrode and the field plate include, inter alia, $SiO_2$, $Si_3N_4$, $SiO_xN_y$, $Al_2O_3$, $ZrO_2$, $Ta_2O_5$, $TiO_2$ and $HfO_2$.

The term "power field effect transistor" as used herein is intended to describe a field effect transistor on an individual chip having high-voltage and/or high-current switching abilities. In other words, power field effect transistors for a high current typically in the amperes range and/or high voltages of typically more than 20 V, particularly more than 400 V, are intended.

The term "edge termination structure" as used herein is intended to describe a structure designed to provide a transition region between zones of different voltages during the operation of a semiconductor component, e.g. between two integrated components or a component in an active zone of the semiconductor component and a peripheral zone of the semiconductor component, in such a way that the maximum field strength between the zones of different voltages is reduced during operation. By way of example, an edge termination structure can be designed to increase the distance between the field lines during operation in critical regions, i.e. regions of high electric field strength e.g. in the vicinity of a surface of the semiconductor component.

Figure 1A:
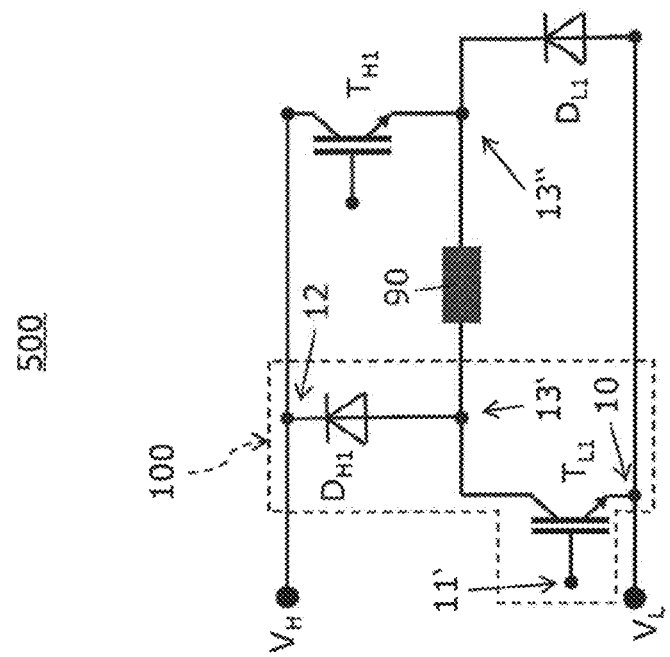
FIG. 1A shows a circuit diagram of a chopper circuit for driving a load in accordance with one embodiment.

FIG. 1A shows a circuit diagram of a chopper circuit 500 for driving a load 90 illustrated as an inductance, e.g. of an electric motor. The chopper circuit 500 has a first voltage terminal $V_L$ and a second voltage terminal $V_H$, to which is applied during operation a higher DC voltage than that applied to the first voltage terminal $V_L$. By way of example, the first voltage terminal $V_L$ can be a ground terminal and the second voltage terminal $V_H$ can be supplied with a positive voltage.

According to this exemplary embodiment, the chopper circuit 500 is embodied as a full bridge having a low-side switch $T_{L1}$, e.g. a low-side IGBT, and a high-side switch $T_{H1}$, e.g. a high-side IGBT, and a low-side diode $D_{L1}$ arranged in the reverse direction and a high-side diode $D_{H1}$ arranged in the reverse direction. In this case, the two switches $T_{L1}$ and $T_{H1}$ and the two diodes $D_{L1}$ and $D_{H1}$ are typically designed as power components.

The chopper circuit 500 has two terminals 13' and 13" for the load 90. In this case, the terminal 13' corresponds to a tap between the series-connected low-side switch $T_{L1}$ and the high-side diode $D_{H1}$ and the terminal 13" corresponds to a tap between the series-connected high-side switch $T_{H1}$ and the low-side diode $D_{L1}$.

In accordance with one exemplary embodiment, the low-side switch $T_{L1}$ and the high-side diode $D_{H1}$ of the chopper circuit 500 are provided by a monolithically integrated power semiconductor component 100, typically a four-terminal power semiconductor component having a common load terminal for the anode of the high-side diode $D_{H1}$ and the collector or drain terminal of the low-side switch $T_{L1}$. The common load terminal is connected to the terminal 13' for the load 90 with low impedance or provides the terminal. In this case, the low-side switch $T_{L1}$ is a power field effect transistor structure having a gate or control terminal 11', a first load terminal 10, which is connected to the first voltage terminal $V_H$ with low impedance, and a second load terminal, which is formed by the common load terminal. Moreover, the second voltage terminal $V_H$ is connected to the cathode terminal 12 of the high-side diode $D_{H1}$, embodied as a power diode, with low impedance. The cathode terminal 12 of the high-side diode $D_{H1}$ is also referred to herein as the first load terminal of the power diode $D_{H1}$.

Typically, the power diode $D_{H1}$ and the power field effect transistor structure $T_{L1}$ are embodied as vertical structures in the monolithically integrated semiconductor component. Moreover, typically at least one edge termination structure is provided between the power diode $D_{H1}$ and the power field effect transistor structure $T_{L1}$. As a result, a high blocking ability of the monolithically integrated semiconductor component can be achieved and/or disturbing influences of power diode $D_{H1}$ and power field effect transistor structure $T_{L1}$ on one another can be at least reduced.

Since, in the construction of the chopper circuit 500, the high-side diode $D_{H1}$ no longer has to be connected to the low-side switch $T_{L1}$, the use of the monolithically integrated power semiconductor component 100 makes it possible to provide a more cost effective driver circuit. Moreover, the monolithically integrated power semiconductor component 100 provides a very short connection between the high-side diode $D_{H1}$ and the low-side switch $T_{L1}$, as a result of which the leakage inductance can be considerably reduced and the driving of the load 90 can thus be improved.

Monolithically integrated semiconductor component embodiments suitable for use in the chopper circuit 500 are explained later herein with reference to FIGS. 3 to 6.

FIG. 1B shows a circuit diagram of a chopper circuit 501 for driving a load $90_1$, $90_2$, $90_3$. The chopper circuit 501 is a half-bridge driver circuit that serves as a driver circuit for a multi-pole electric motor, e.g. a stepper motor or a switched reluctance motor (SR motor). In this exemplary embodiment, the chopper circuit 501 comprises three monolithically integrated and series-connected semiconductor components 100, the respective terminal 13' of which is connected to one of the three exemplary phases or poles $90_1, 90_2, 90_3$ of the load. The first voltage terminal $V_L$ is connected to the first load terminal of the respective low-side switch $T_{L1}$ with low impedance. Moreover, the second voltage terminal $V_H$ is connected to the respective cathode terminal of the respective high-side diode $D_{H1}$ with low impedance.

In further embodiments, the chopper circuit 501 has more than three series-connected monolithically integrated semiconductor components 100, in order to drive e.g. SR motors having more than three phases or stepper motors having a correspondingly high number of pole pairs.

Since, in the construction of the chopper circuit 501, per-phase or per-pole of the load, an electrical connection between high-side diode $D_{H1}$ and low-side switch $T_{L1}$ is provided by the respective monolithically integrated power semiconductor component 100, the chopper circuit 501 can correspondingly be constructed more cost-effectively and with a shorter connection between high-side diode $D_{H1}$ and low-side switch $T_{L1}$, as a result of which the circuit properties can be improved.

Figure 2:
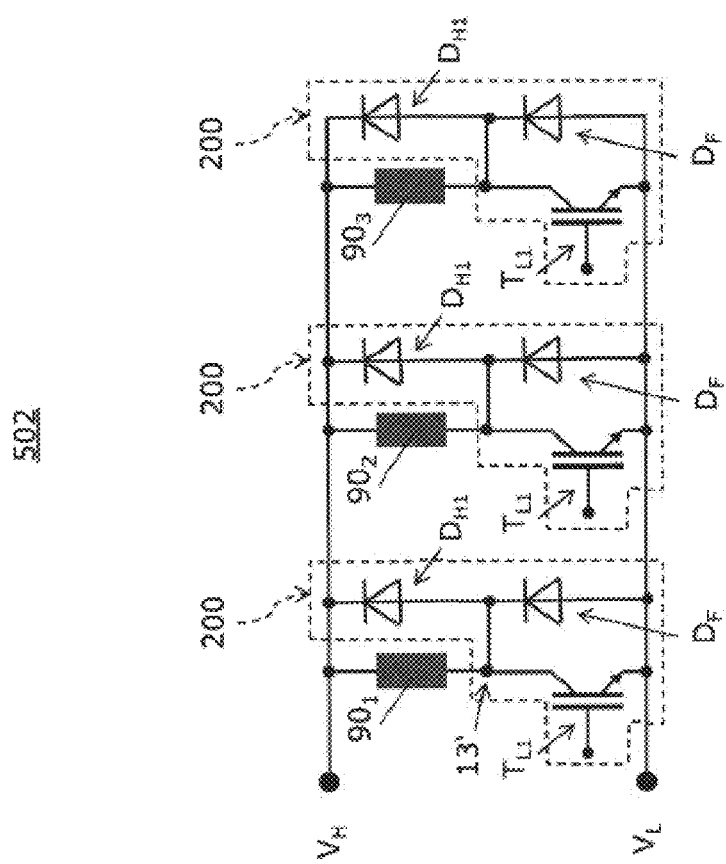
FIG. 2 shows a circuit diagram of a chopper circuit for driving a load in accordance with another embodiment.

FIG. 2 shows a circuit diagram of a chopper circuit 502 for driving of load $90, 90_1, 90_2, 90_3$. The chopper circuit 502 is similar to the chopper circuit 501 explained above with reference to FIG. 1B, wherein an additional freewheeling diode $D_F$, also referred to herein as inverse diode, is integrated in each case in the series-connected monolithically integrated semiconductor components 200 of the chopper circuit 502. As explained in detail below with reference to FIG. 4, the freewheeling diode $D_F$ can easily be concomitantly integrated into vertical IGBT structures typically used as the low-side switches $T_{L1}$.

In so-called single-ended IGBT circuits, as illustrated e.g. in FIG. 1B, the IGBT used as a low-side switch $T_{L1}$ can be briefly biased in the negative direction by circuit parasitics. However, the rear-side emitter of an IGBT is typically not designed for a corresponding blocking loading, since it usually has only a relatively low doping and relatively small penetration depth. The current in the case of an IGBT biased in the negative direction can be conducted away by the antiparallel diode $D_F$. In this case, typically no special dynamic requirements are made of the inverse diodes $D_F$. The inverse diodes $D_F$ can be operated e.g. only with a very small current flow angle and/or with low current magnitudes compared with the load current.

By virtue of the additional integration of the inverse diodes $D_F$ into the monolithically integrated semiconductor components 200, the chopper circuit 502 can be constructed particularly cost-effectively.

Embodiments of integrated power semiconductor components and production methods therefor are described later herein principally with reference to semiconductor components composed of silicon (Si). Accordingly, a monocrystalline semiconductor zone or a monocrystalline semiconductor layer is typically a monocrystalline Si zone or a monocrystalline Si layer. It goes without saying however, that the semiconductor body can be produced from an arbitrary semiconductor material which is suitable for producing a semiconductor component. Examples of such materials include, inter alia, elemental semiconductor materials such as, for instance, silicon (Si) or germanium (Ge) and their mixed forms ($Si_xGe_y$), group IV compound semiconductor materials such as, for instance, silicon carbide (SiC) or silicon-germanium (SiGe), binary, ternary or quaternary III-V semiconductor materials such as, for instance, gallium nitride (GaN), gallium arsenide (GaAs), gallium phosphide (GaP), indium phosphide (InP), indium gallium phosphide (InGaP) or indium gallium arsenide phosphide (InGaAsP) and binary or ternary II-VI semiconductor materials such as, for instance, cadmium telluride (CdTe) and mercury cadmium telluride (HgCdTe), to name just a few. The abovementioned semiconductor materials are also designated as homojunction semiconductor materials. If two different semiconductor materials are combined, a heterojunction semiconductor material arises. Examples of heterojunction semiconductor materials include, inter alia, aluminum gallium nitride (AlGaN) and gallium nitride (GaN) or silicon-silicon carbide ($Si_xC_{1-x}$) and SiGe heterojunction semiconductor material. The materials Si, SiC and GaN are principally used at the present time for power semiconductor applications. If the semiconductor body comprises a material having a large band gap such as SiC or GaN, for instance, which has a high breakdown voltage or a high critical electric field strength at which avalanche multiplication commences, the doping of the respective semiconductor zones can be chosen to be higher, which reduces the on resistance $R_{on}$.

Figure 3:
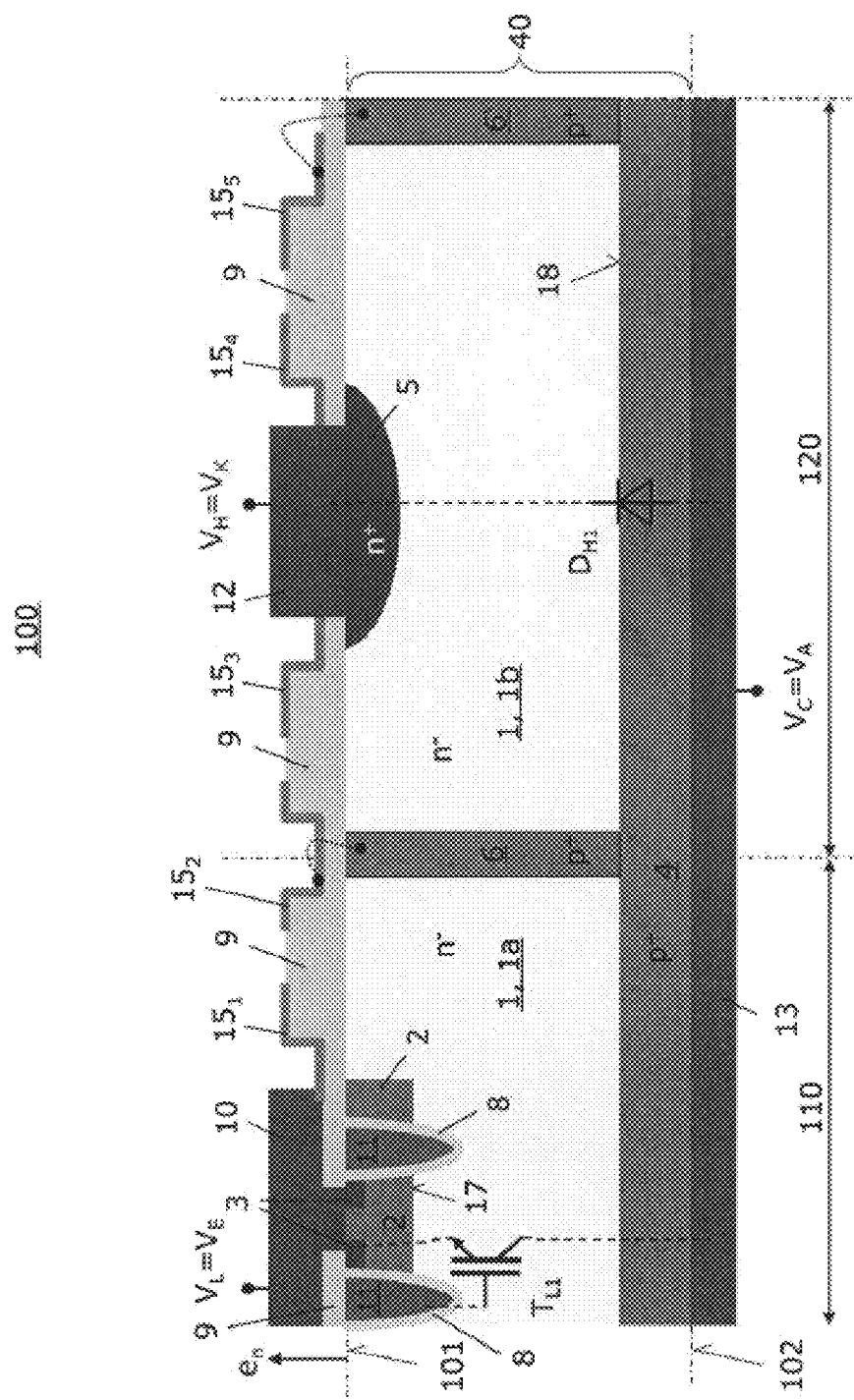
FIG. 3 shows a schematic cross section through a monolithically integrated power semiconductor component in accordance with one embodiment.

FIG. 3 shows a schematic cross section through a monolithically integrated power semiconductor component 100 which can be used in the chopper circuits 500, 501 explained above with reference to FIGS. 1A and 1B. The power semiconductor component 100 comprises a semiconductor body 40 having a first region 110 and a second region 120, which extend in each case from a first surface 101 of the semiconductor body 40 as far as a second surface 102 of the semiconductor body 40, the second surface 102 being opposite the first surface 101. A normal direction $e_n$ with respect to the first surface 101 defines a vertical direction.

The semiconductor body 40 is typically a wafer or a chip. The semiconductor body 40 can have a semiconductor substrate and one or more epitaxial layers grown thereon.

A vertical power field effect transistor structure $T_{L1}$ is formed in the first region 110. In the exemplary embodiment illustrated in FIG. 3, the vertical power field effect transistor structure $T_{L1}$ is formed by a vertical n-channel IGBT. An emitter terminal 10 arranged on the first surface 101 of the semiconductor body 40 forms the first load terminal. A part of a common load terminal 13 arranged on the second surface 102 of the semiconductor body 40, the part being arranged in the first region 110, forms a second load terminal or collector terminal of the power field effect transistor structure $T_{L1}$.

The common load terminal 13 is in ohmic contact with a heavily p-doped semiconductor layer 4, which extends as far as the second surface 102 and is also referred to herein as fourth semiconductor zone. A part of the semiconductor layer 4 arranged in the first region 110 forms a collector zone of the n-channel IGBT. An n-doped first semiconductor zone 1*a*, also referred to herein as drift zone, is arranged on the collector zone and with the collector zone forms a pn junction. The drift zone 1*a* typically extends as far as the first surface 101. A p-doped second semiconductor zone 2, also referred to herein as body zone, with the drift zone 1*a* forms a further pn junction 17, also referred to herein as first pn junction, and likewise extends as far as the first surface 101 in this exemplary embodiment. Two heavily n-doped emitter zones 3 are embedded into the body zone 2, in vertical cross section, which, like the body zone 2, are in ohmic contact with the emitter terminal 10 and with the body zone 2 form a second pn junction. However, the body zone 2 and/or the emitter zones 3 can also be connected to the emitter terminal 10 via a trench contact. For controlling a load current between the emitter terminal 10 and the common load terminal 13, two gate electrodes 8 separated from the semiconductor body 40 by respective gate oxides 8 extend in a vertical direction from the respective emitter zone 3 through the body zone 2 partly into the drift zone 1*a*. Alternatively, the gate electrodes 11 can also be arranged on the first surface 101 if the power field effect transistor structure $T_{L1}$ is embodied as a DMOS field effect transistor.

Typically, the power field effect transistor structure $T_{L1}$ is formed by a multiplicity of similarly or identically constructed cells in the first region 110, in order to be able to switch high currents.

A power diode $D_{H1}$ is formed in the second region 120, typically a pn diode. The anode terminal of the power diode $D_{H1}$ is formed by a part of the common load terminal 13, the part being arranged in the second region 120. That part of the p-doped layer 4 which is arranged in the second region 120 forms an anode zone of the power diode $D_{H1}$. The anode zone, with an n-doped base zone 1b, forms a load pn junction 18, typically a vertical pn junction, of the power diode $D_{H1}$. Through the use of the common load terminal 13 in the integrated power semiconductor component 100, driver circuits can be constructed more cost-effectively and with a smaller stray capacitance.

Typically, the n-doped base zone 1b of the power diode $D_{H1}$ and the drift zone 1a of the power field effect transistor structure $T_{L1}$ are formed in a first n-type semiconductor layer 1 or from parts of the first semiconductor layer 1. This simplifies the production of the semiconductor component 100. The maximum dopant concentrations of the drift zone 1a and base zone 1b can be identical or different. By way of example, the power diode $D_{H1}$ can be a pin or pn⁻n diode having an intrinsic or virtually intrinsic dopant concentration of the base zone 1b and the drift zone 1a is more highly doped than the base zone 1b.

The cathode terminal 12, forming the first load terminal of the power diode $D_{H1}$, is arranged in the second region 120 on the first surface 101 of the semiconductor body 40 and is connected to the base zone 1b of the power diode $D_{H1}$ e.g. via an ohmic contact formed by a heavily n-doped contact zone 5.

In a chopper circuit such as has been explained above with reference to FIGS. 1A to 2, the first load terminal 10 of the power field effect transistor structure $T_{L1}$ of the semiconductor component 100 is connected to the first voltage terminal, the cathode terminal 12 of the power diode $D_{H1}$ of the semiconductor component 100 is connected to the second voltage terminal, and the common load terminal is connected to the load.

Since a positive voltage difference between the second voltage terminal and the first voltage terminal is present during the operation of the chopper circuit, which difference can also be more than 100 V or even more than 400 V depending on the application, typically at least one edge termination structure 15₁, 15₂, 15₃, 9 is arranged adjacent to the first surface 101 in the horizontal direction between the first load terminal 10 of the power field effect transistor structure $T_{L1}$ and the first load terminal 12 of the power diode $D_{H1}$. It is thereby possible to take up the voltage differences between the first region 110 and the second region 120 in a space- and thus cost-saving manner.

In this case, the at least one edge termination structure can comprise a field plate 15, and/or a VLD (variation of lateral doping) edge termination structure and/or a JTE (junction termination extension) edge termination structure and/or a field ring edge termination structure and/or a vertical edge termination structure, which are in each case arranged adjacent to the first surface 101.

In this exemplary embodiment, a first field plate 15₁, which is connected to the first load electrode 10 of the power field effect transistor structure $T_{L1}$, a second field plate 15₂, which is connected to the common load terminal 13, and a third field plate 15₃, which is connected to the first load electrode 12 of the power diode $D_{H1}$, are arranged between the first load electrode 10 of the power field effect transistor structure $T_{L1}$ and the first load electrode 12 of the power diode $D_{H1}$ on the first surface 101 and in a manner separated from the latter and from one another by respective dielectric zones 9 acting as a field oxide. In this case, the second field plate 15₂ is arranged in the horizontal direction between the first field plate 15₁ and the third field plate 15₃.

In accordance with one embodiment, a p-doped sixth semiconductor zone 6, which extends from the first surface 101 as far as the fourth semiconductor layer 4, is arranged in the horizontal direction between the first load terminal 10 of the power field effect transistor structure $T_{L1}$ and the first load terminal 12 of the power diode $D_{H1}$. The sixth semiconductor zone 6 can serve firstly for making contact between the second field plate 15₂ and the common load terminal 13 and secondly as a lateral isolation between the drift zone 1a of the power field effect transistor structure $T_{L1}$ and the base zone 1b of the power diode $D_{H1}$ and therefore can also be regarded as an edge termination structure or part of an edge termination structure. During operation in a chopper circuit, either a reverse voltage is present at the IGBT $T_{L1}$ (the voltage difference across the diode $D_{H1}$ is then virtually zero) or, conversely, the diode $D_{H1}$ sees a reverse voltage, which is synonymous with the on state of the IGBT $T_{L1}$. The vertical sixth semiconductor zone 6 effectively prevents the injection of charge carriers from conducting into the respectively blocking component $T_{L1}$, $D_{H1}$.

In chopper circuits, the rear side of the semiconductor component 100 forms the common node of the collector of the IGBT $T_{L1}$ and the anode of the diode $D_{H1}$. The leadframe onto which the rear side of the semiconductor component 100 is typically mounted and also the common load terminal 13, which is typically embodied as rear-side metallization, can serve as low-impedance connection of collector and anode. Leakage inductances are effectively avoided by virtue of this very short connection. As a result, overvoltages are reduced during the commutation of the current from the IGBT $T_{L1}$ to the diode $D_{H1}$, or vice-versa, with the result that the switching speed can be increased, which reduces switching losses. This also reduces the requirements made of the softness of the diode during turn-off and thus also makes it possible to reduce the thickness of the base zone 1b of the diode $D_{H1}$, which further reduces switching losses. In this case the vertical extent of the base zone 1b can be set not only by way of the total thickness of the semiconductor component 100, but also by way of the vertical extent of the contact zone 5 of the diode $D_{H1}$.

In accordance with one embodiment, at least one further edge termination structure is arranged adjacent to the first surface 101 and in the horizontal direction not between the first load terminal 10 of the power field effect transistor structure $T_{L1}$ and the first load terminal 12 of the power diode $D_{H1}$. It is thereby possible to dissipate voltages to further integrated components and/or to the edge of the semiconductor component 100.

In the exemplary embodiment of FIG. 3, for this purpose use is made of a fourth field plate 15₄, which is connected to the first load electrode 12 of the power diode $D_{H1}$, and a fifth field plate 15₅, which is arranged adjacent thereto and connected to the common load terminal 13. The fourth and fifth field plates 15₄, 15₅ are in each case arranged on the first surface 101 and are spaced apart from one another and from the first surface 101 by a dielectric zone 9. The fifth field plate 15₅ can be electrically connected to the common load terminal 13 by a further vertical p-doped semiconductor zone 6', which extends in the second region 120 from the first surface 101 as far as the semiconductor layer 4 and can likewise form an edge termination structure.

Figure 4:
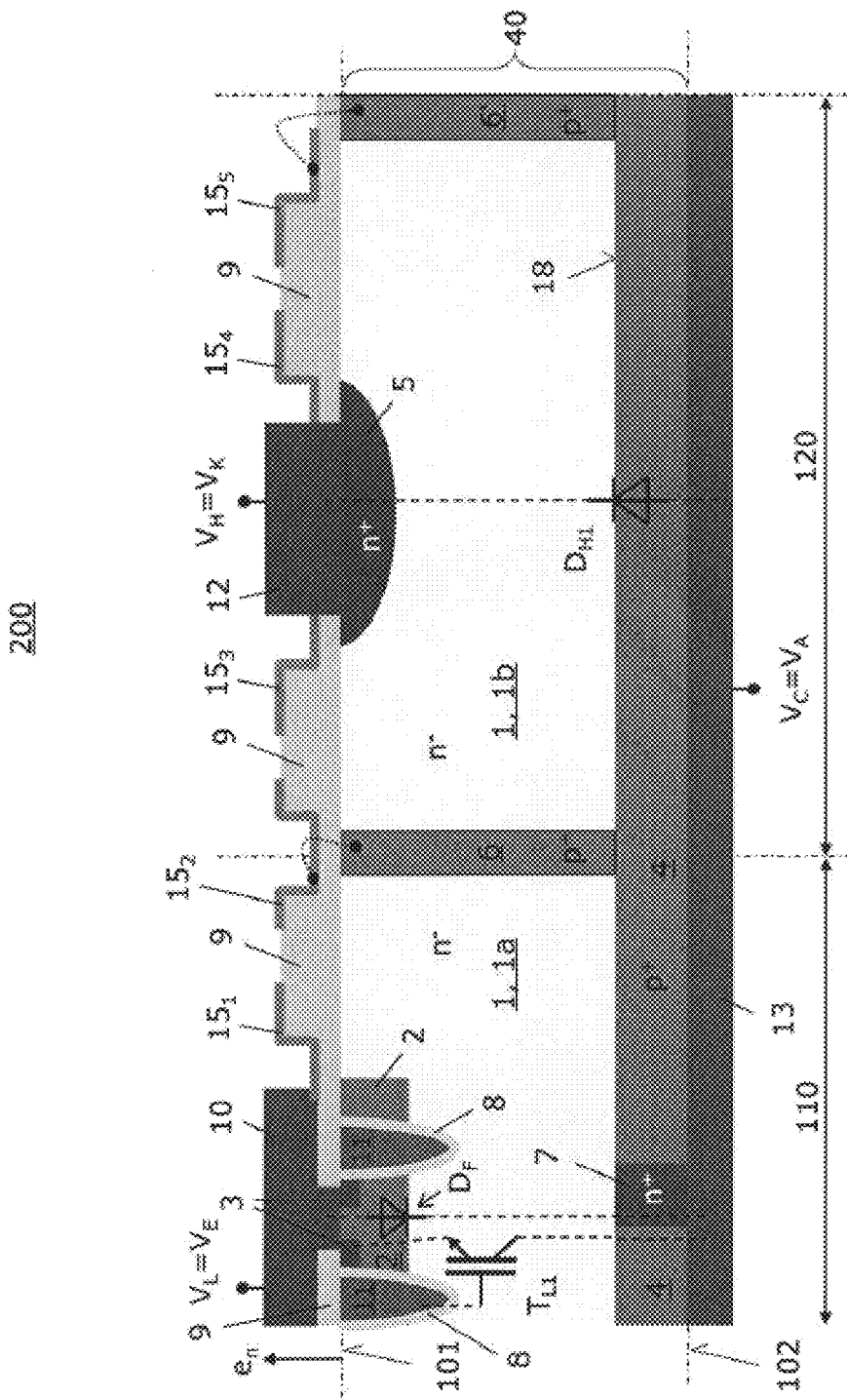
FIG. 4 shows a schematic cross section through a monolithically integrated power semiconductor component in accordance with a further embodiment.

FIG. 4 shows a schematic cross section through a monolithically integrated power semiconductor component 200. The power semiconductor component 200 is constructed similarly to the semiconductor component 100 explained above with reference to FIG. 3. In addition to the vertical IGBT $T_{L1}$, a vertical freewheeling diode $D_F$ is integrated in the first region 110, such that the semiconductor component 200 can also be used in the chopper circuit 502 explained above with reference to FIG. 2. In this exemplary embodiment, the drift zone 1a of the IGBT $T_{L1}$ is ohmically connected to the common load terminal 13 by a heavily n-doped zone 7, as a result of which the body diode of the IGBT $T_{L1}$ can be operated as an integrated freewheeling diode $D_F$.

Figure 5:
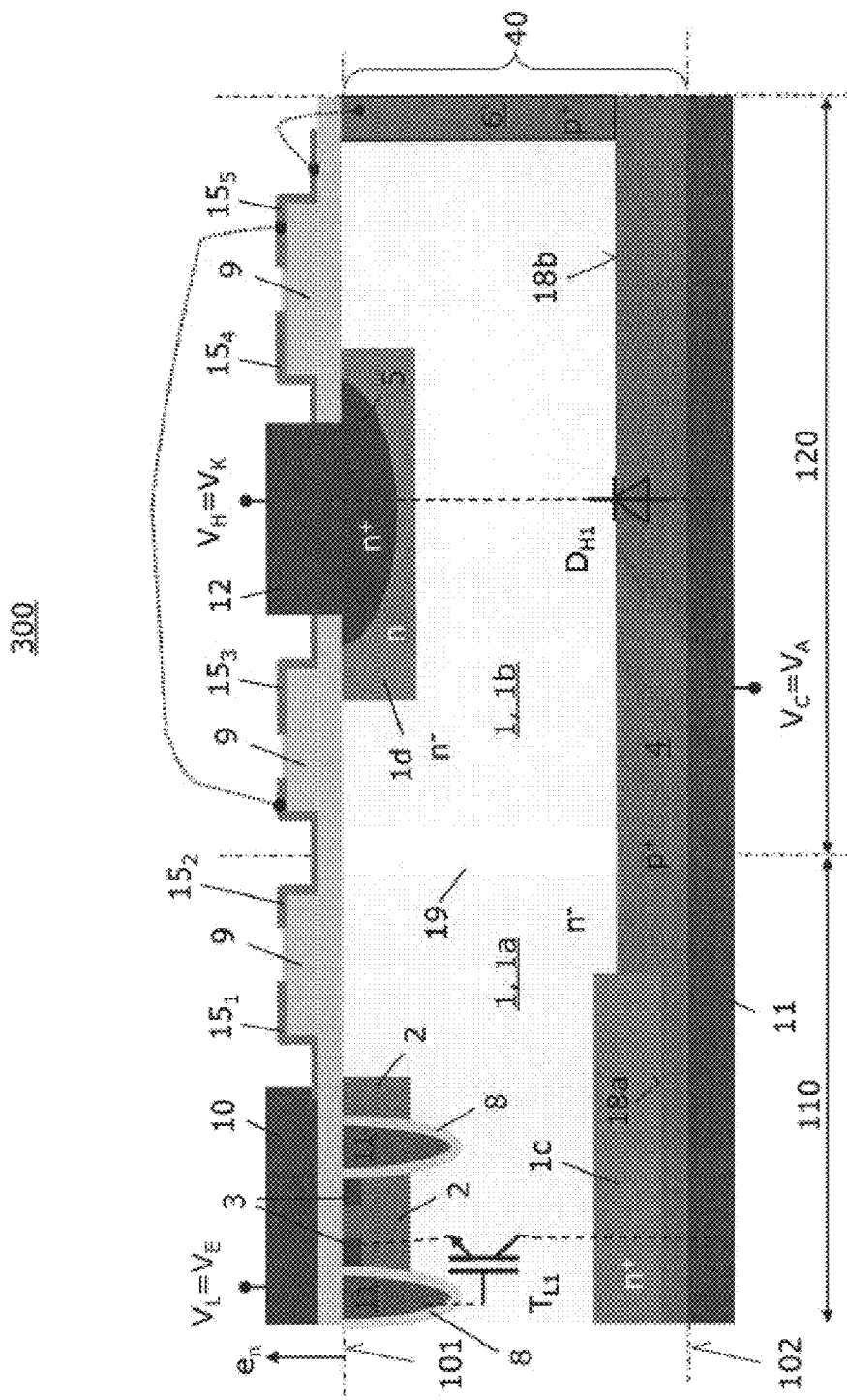
FIG. 5 shows a schematic cross section through a monolithically integrated power semiconductor component in accordance with a further embodiment.

FIG. 5 shows a schematic cross section through a monolithically integrated power semiconductor component 300. The power semiconductor component 300 is constructed similarly to the semiconductor component 100 explained above with reference to FIG. 3 and can likewise be used in the chopper circuits 500, 501 explained above with reference to FIGS. 1A and 1B. Instead of the vertical p-doped semiconductor zone extending in a boundary zone between the first region 110 and the second region 120 of the semiconductor component 100 from the first surface 101 as far as the fourth semiconductor layer 4, the drift zone 1a of the IGBT $T_{L1}$ and the base zone 1b of the diode $D_{H1}$ are separated from one another laterally by an insulating vertical zone 19. The insulating vertical zone 19 extends from the first surface 101 as far as the fourth semiconductor layer 4 and is arranged in the horizontal direction between the first load terminal 10 of the power field effect transistor structure $T_{L1}$ and the first load terminal 12 of the power diode $D_{H1}$. As a result, the mutual penetration of charge carriers can be prevented particularly effectively.

In FIGS. 3 and 4, the power field effect transistor structure $T_{L1}$ and the power diode $D_{H1}$ are embodied as NPT (non-punch through) structures. As shown in FIG. 5 for the semiconductor component 300, n-doped field stop zones 1c, 1d can be provided near the rear side of the $T_{L1}$ in the first region 110 and/or near the front-side cathode 12 of the power diode $D_{H1}$, in order to reduce the active thickness of the semiconductors and thus the losses during operation and to set the softness of the power diode $D_{H1}$. The n-doped field stop zones 1c, 1d can be produced e.g. by a masked selenium diffusion on both sides.

In accordance with a further embodiment, the fourth semiconductor zone 4 is more highly doped in the second region 120 than in the first region 110. As a result, the power diode $D_{H1}$ acquires a more highly doped rear-side p-type emitter, in order to ensure an improved blocking ability and switching robustness or cosmic radiation resistance (avoidance of dynamic punch through) of the diode. The IGBT $T_{L1}$ has a less efficient emitter according to this embodiment, in order to reduce the turn-off losses of the IGBT.

In accordance with yet another embodiment, a vertical freewheeling diode $D_F$ is additionally integrated in the first region 110, as was explained with reference to FIG. 4.

In the case of freewheeling diodes, typically the charge carrier lifetime is additionally set in order to realize a favorable trade-off between on-state and switching losses. If use is made of a strong p-type emitter 4 in the region 110 for the IGBT $T_{L1}$, then the p-type emitter efficiency of IGBT $T_{L1}$ and diode $D_{H1}$ can be reduced over the whole area, e.g. by means of a rear-side implantation of light particles, in particular protons, helium nuclei, or light ions. However, the charge carrier lifetime can also be reduced only locally in the region 120 for the anode of the diode, e.g. by means of masked implantation. Since the rear-side field stop 1c of the IGBT $T_{L1}$ can likewise be produced by means of masked irradiation with protons and an annealing step, the production of the semiconductor component is simplified or becomes more cost-effective since the fundamentally identical processes can be applied multiply in succession and merely with different furnace and heat-treatment processes.

Figure 6:
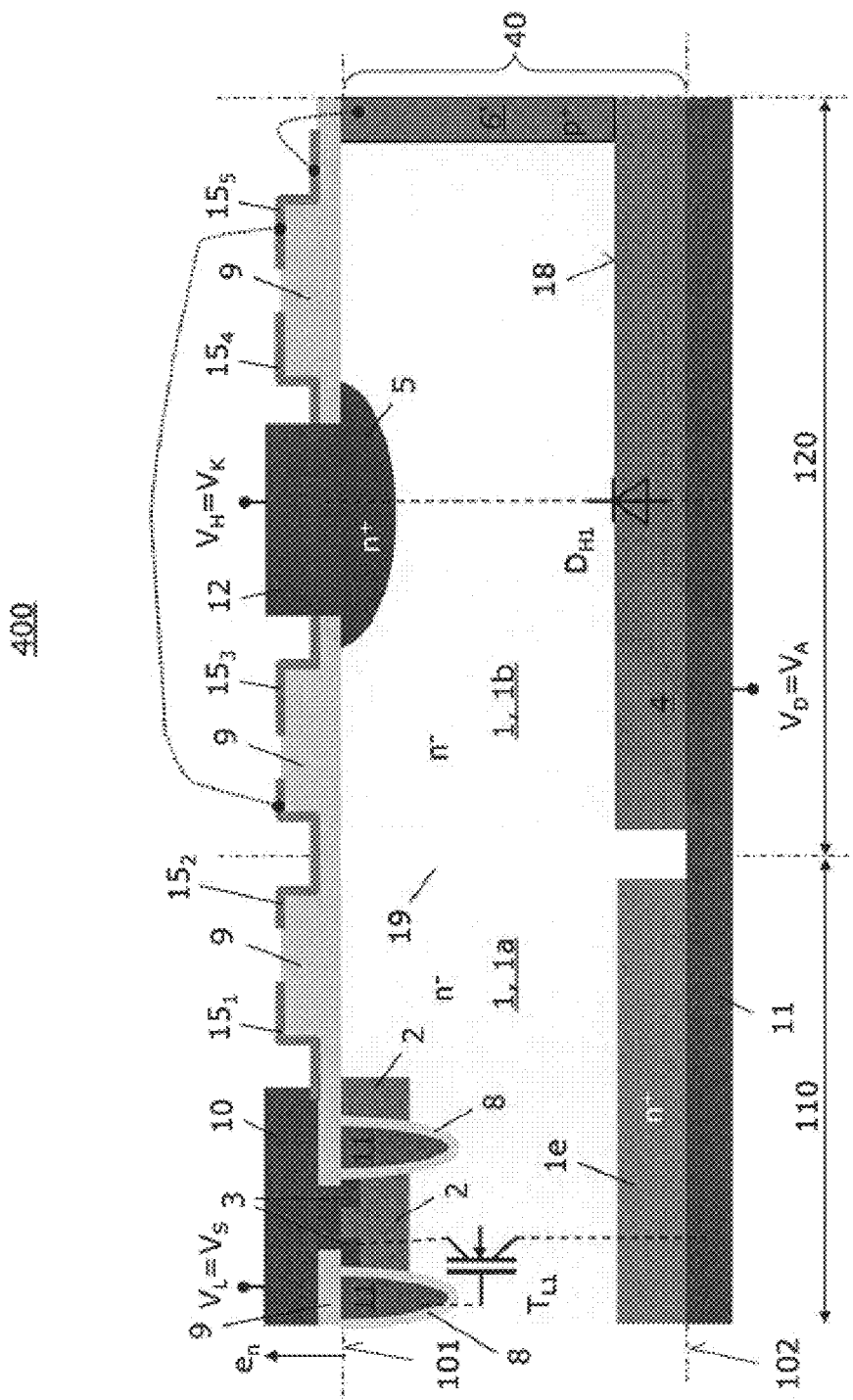
FIG. 6 shows a schematic cross section through a monolithically integrated power semiconductor component in accordance with yet another embodiment.

FIG. 6 shows a schematic cross section through a monolithically integrated power semiconductor component 400. The power semiconductor component 400 is constructed similarly to the semiconductor component 100 explained above with reference to FIG. 3 and can likewise be used in chopper circuits such as have been explained above with reference to FIGS. 1A to 2. Instead of a vertical IGBT, however, a vertical re-channel MOSFET structure is provided as the power field effect transistor structure $T_{L1}$ in the first region 110 of the power semiconductor component 400. In this case, the common load terminal 11 in the first region 110 forms a drain terminal, which is ohmically connected to the drift zone 1a of the power MOSFET $T_{L1}$ via a highly n-doped drain zone 1e, and the first load terminal 10 forms a source terminal, which is in ohmic contact with the n-doped source zones 3 and the body zone 2.

In this exemplary embodiment, the insulating zone 19 extends in the vertical direction from the first surface 101 as far as the second surface 102. As a result, the drift zone 1a and the base zone 1b are laterally insulated from one another. Moreover, the insulating zone 19 can serve as a stop zone during production. This will be explained in detail below for a monolithically integrated power semiconductor component comprising an IGBT as power field effect transistor structure.

Figure 7:
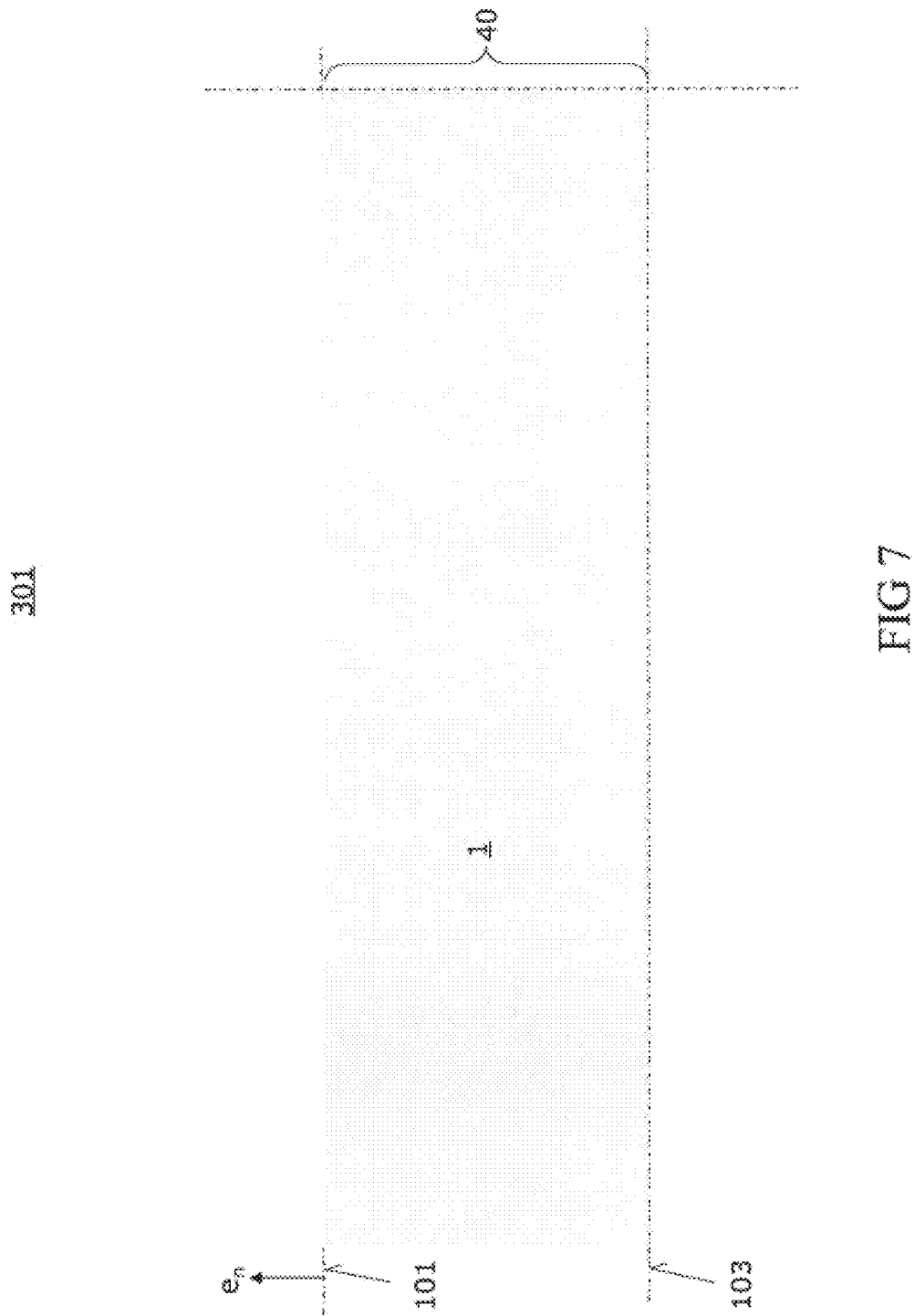
FIG. 7 to FIG. 11 show schematic vertical cross sections through a semiconductor body during the production of an integrated power semiconductor component in accordance with one or more embodiments.
Figure 8:
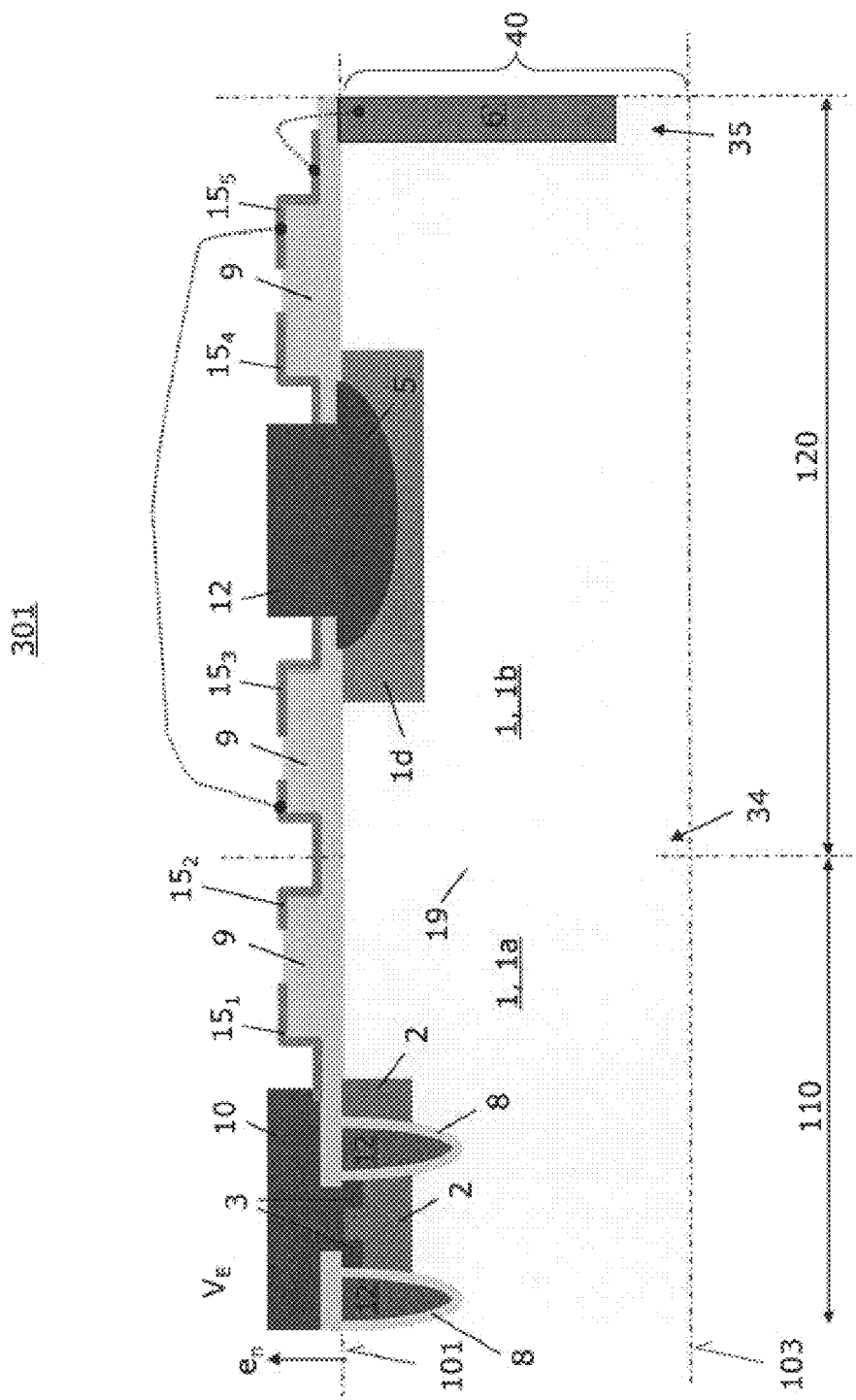
Figure 9:
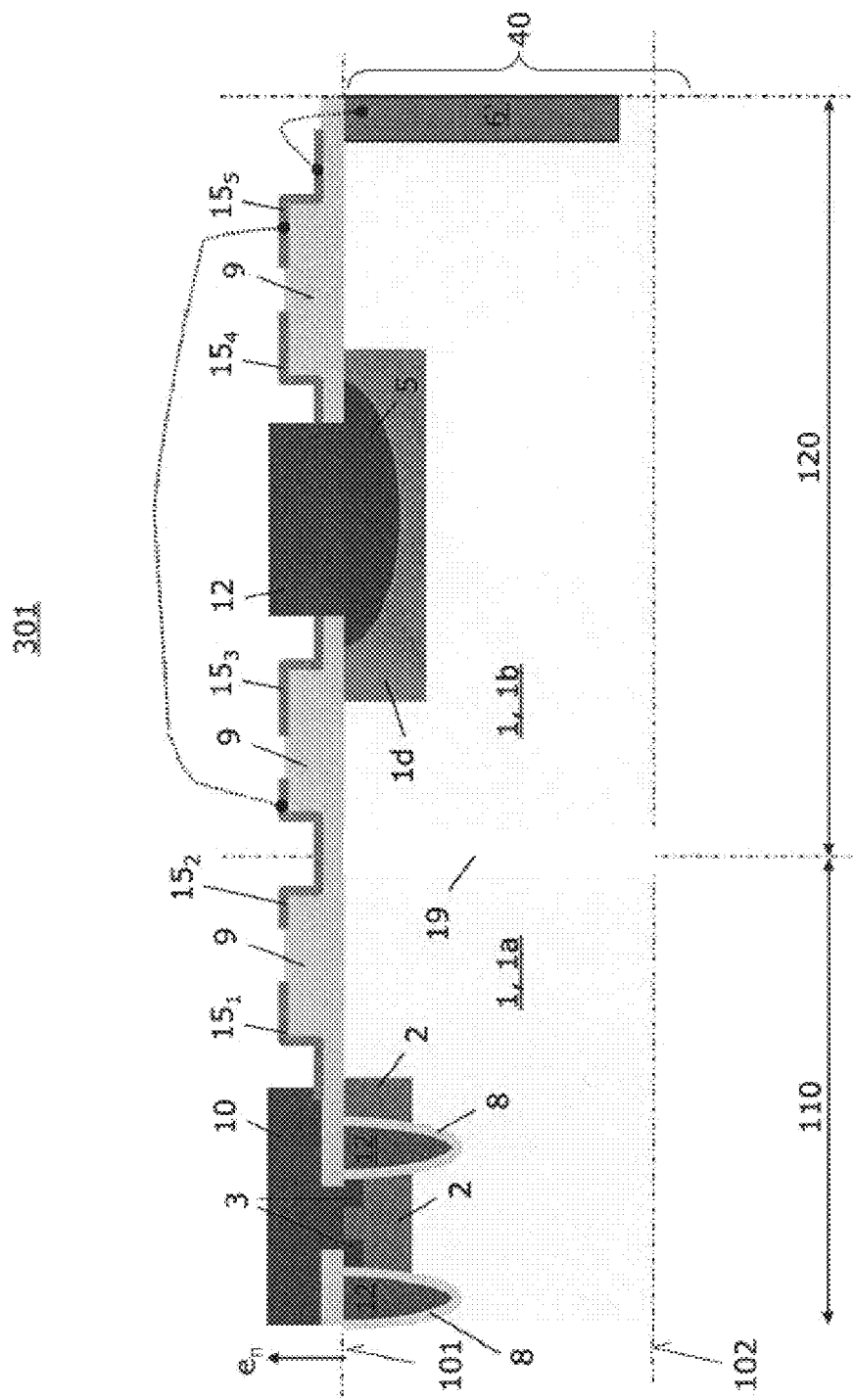
Figure 10:
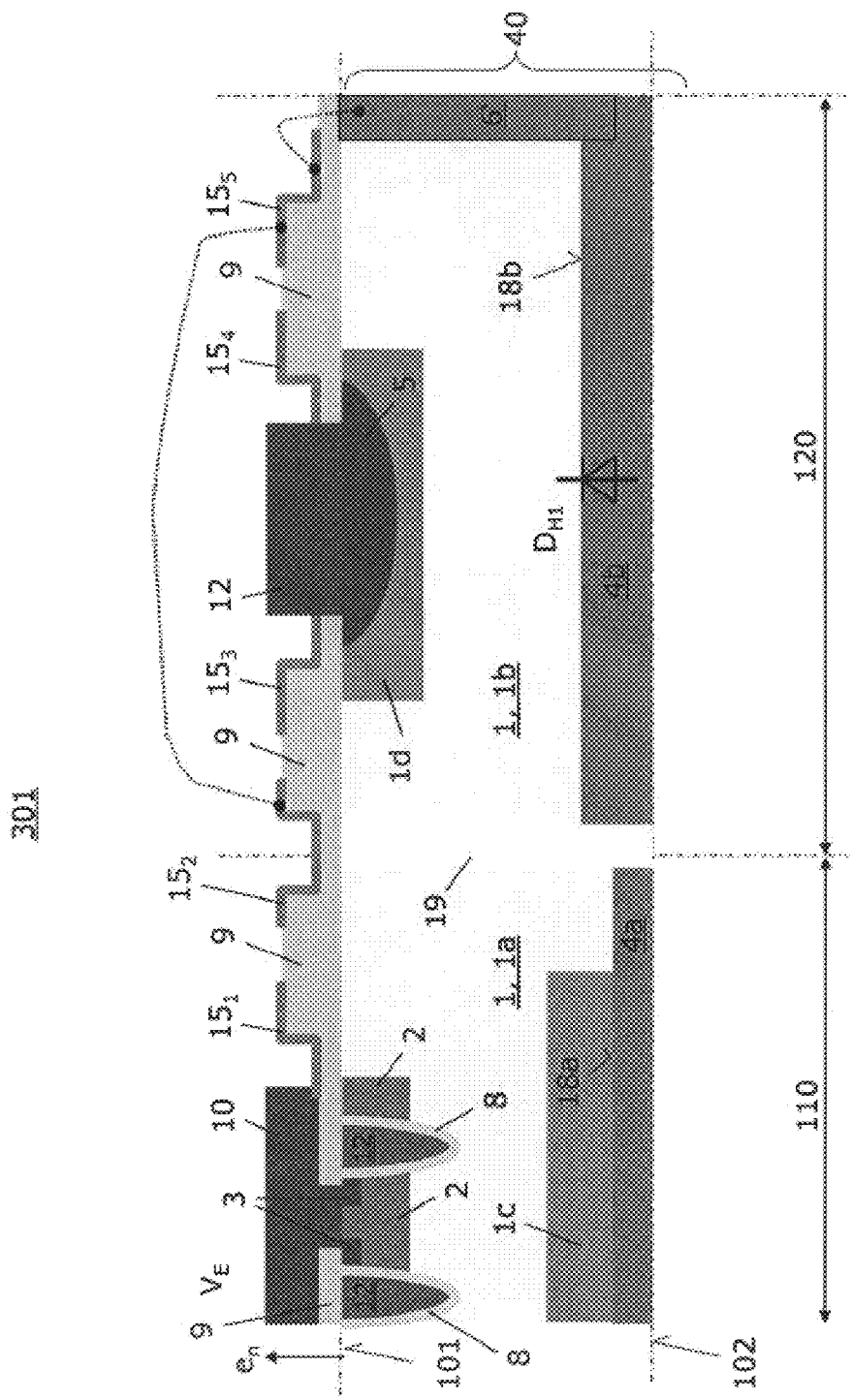

Method steps for producing a vertical integrated semiconductor component 301 are elucidated in vertical sections with reference to FIGS. 7 to 11. A first step involves providing a semiconductor body 40, typically a wafer, having a first surface 101 or top side and an opposite underside 103. FIG. 7 shows the semiconductor body 40 in a schematic vertical cross section. The normal direction $e_n$ with respect to the top side 101 runs substantially parallel to the vertical direction, i.e. defines it. A first semiconductor layer 1 of a first conductivity type (n-type) extends from the top side 101 as far as the underside 103.

Afterward, the semiconductor body 40 is processed firstly from the top side 101. In this case, a field effect structure $T_{L1}$ is formed in a first region 110 and a contact structure to the first semiconductor layer 1 is formed in a second region 120 of the semiconductor body 40.

In this case, the channel type of the field effect structure $T_{L1}$ corresponds to the conductivity type of the first semiconductor layer 1. This means that, in the example of the exemplary embodiment illustrated in FIG. 8, an n-channel field effect structure $T_{L1}$ is formed in the first region 110. For this purpose, in the first region 110, typically a semiconductor zone 2 of the second conductivity type, which can be operated as a body zone of the field effect structure $T_{L1}$, is formed in the first semiconductor layer 1. One or more highly n-doped third semiconductor zones 3 of the first conductivity type, which can be operated as emitter or source zones of the field effect structure $T_{L1}$, are formed in the semiconductor zone 2. One or more insulated gate electrodes 11, 8 are also formed. Moreover, a first load electrode 10 is formed in the first region 110 on the top side 101. The first load electrode 10 is in ohmic contact with the second and third semiconductor zones 2, 3.

Typically, a multiplicity of identically constructed cells is formed in the first region 110, in order to switch high currents.

Forming the contact structure in the second region 120 typically comprises forming a highly doped contact region 5 of the first semiconductor layer 1 and forming a further load electrode 12, which forms a cathode or first load electrode of the diode in the finished semiconductor component.

In accordance with one exemplary embodiment, a field stop region 1*d* of the first conductivity type is formed between the contact zone 5 and the first semiconductor layer 1 in the second region 120. The field stop region 1*d* can be formed by means of a masked implantation or a selenium diffusion through the top side 101 in the second region 120.

Furthermore, from the top side 101, typically one or more edge termination structures are formed between the first load electrode 10 and the further load electrode 12. In the example of the exemplary embodiment, a first field plate 15$_1$, which is connected to the first load electrode 10, a second field plate 15$_2$, which is later connected to a common load terminal, and a third field plate 15$_3$, which is connected to the further load electrode 12, are formed between the first load electrode 10 and the further load electrode 12 on the first surface 101 and are separated from the latter and from one another by respective dielectric zones 9. In this case, the second field plate 15$_2$ is arranged in the horizontal direction between the first field plate 15$_1$ and the third field plate 15$_3$.

Moreover, a fourth field plate 15$_4$, which is connected to the further load electrode 12, and a fifth field plate 15$_5$ which is arranged adjacent thereto and which is connected to the second field plate 15$_2$, can be formed on the top side 101.

Before the field plates 15$_1$-15$_5$ are formed, typically two vertical trenches 34, 35 are etched into the semiconductor body 40 from the top side 101, the vertical trench 34 being etched in a boundary zone between the first region 110 and second region 120, and are at least partly filled. In the example of the exemplary embodiment shown in FIG. 8, the vertical trench 34 is filled with a dielectric zone or insulating zone 19 and the vertical trench 35 is filled with a semiconductor material of the second conductivity type, e.g. with correspondingly doped polysilicon. As an alternative thereto, the vertical trench 34 can also be filled with a semiconductor material of the second conductivity type and/or contain cavities. By way of example, a central cavity can be situated in the dielectric zone 19.

Afterward, the semiconductor body 40 is thinned at the underside 103, e.g. by means of a CMP (chemical mechanical polishing) process, in order to produce a rear side 102. In this case, the dielectric zone 19 can be used as a stopper during the thinning of the semiconductor body 40. The resulting semiconductor structure 301 is illustrated schematically in FIG. 9. As a result, the first semiconductor layer 1 is divided into two semiconductor zones 1*a*, 1*b*.

Afterward, a vertical pn junction 18*b*, i.e. a pn junction oriented substantially parallel to the top side 101, is formed at least in the second region 120, in order to form a vertical diode $D_{H1}$ in the second region 120. If a vertical IGBT structure is intended to be formed in the first region 110, a vertical pn junction 18*a* is also formed in the first region 110. The pn junctions 18*a*, 18*b* can be implemented by corresponding implantations of dopants from the rear side 102 and subsequent heat treatment, wherein the dopant concentration and/or the vertical extent of the fourth semiconductor zones 4*a*, 4*b* formed in this case can be different. By way of example, a maximum dopant concentration of the semiconductor zone 4*a* in the first region can be lower than the maximum dopant concentration of the semiconductor zone 4*b* in the second region 120. The resulting semiconductor structure 301 is illustrated schematically in FIG. 10, wherein a field stop region 1*c* of the first conductivity type is additionally formed between the semiconductor zone 1*a* and the fourth semiconductor zone 4*a* in the second region 120, e.g. by means of masked implantation or selenium indiffusion.

In accordance with one embodiment, the first region 110 and/or the second region 120 of the semiconductor body 40 are/is irradiated with protons and/or light ions from the rear side 102. As a result, the charge carrier lifetime can be reduced after a further heat treatment process or a joint heat treatment process for the formation of the field stop region 1*c*.

Figure 11:
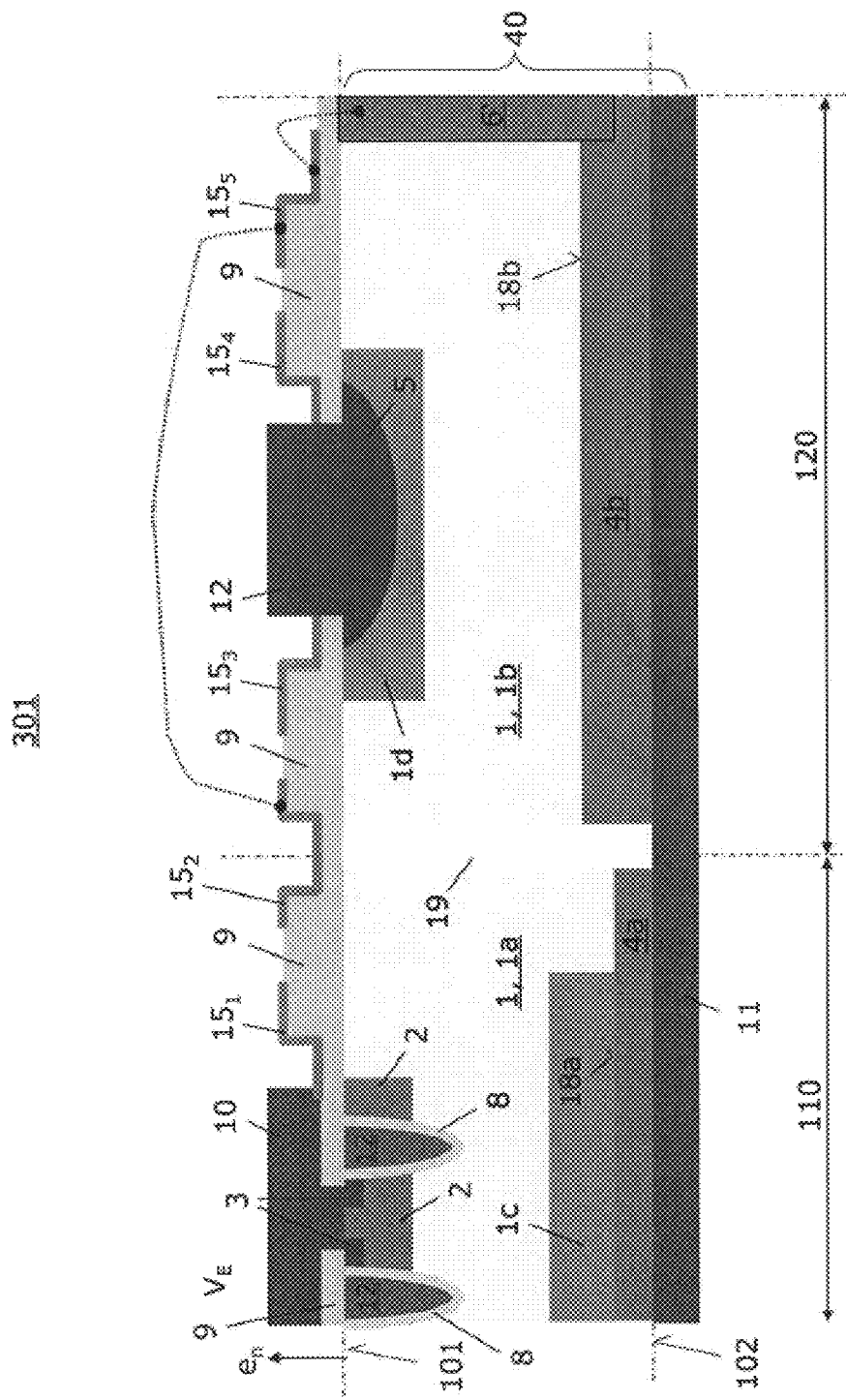

Afterward, a common load electrode 11 is formed, e.g. by non-masked deposition of a metal such as aluminum or a stack—coordinated with assembly—of metals and/or alloys onto the semiconductor body 40, on the rear side 102 in the first region 110 and in the second region 120. Typical metals which can be applied in layers and/or alloys on the rear side 102 of the semiconductor body 40 comprise aluminum, nickel, titanium, vanadium, silver, gold and platinum. The common load electrode 11 is in ohmic contact with the first region 110 and the second region 120 of the semiconductor body 40, e.g. in direct contact with the highly doped semiconductor zones 4*a*, 4*b*. FIG. 11 shows the resulting integrated semiconductor component 301 in a schematic cross sectional illustration. The integrated semiconductor component 301 is similar to the semiconductor component 300 explained above with reference to FIG. 5 and can likewise be used in chopper circuits.

The present invention has been explained on the basis of exemplary embodiments. On no account should these exemplary embodiments be understood as restrictive for the present invention.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A monolithically integrated power semiconductor component, comprising:
   a semiconductor body having a first region and a second region, the first region and the second region each extending from a first surface of the semiconductor body to a second surface of the semiconductor body, the second surface being opposite the first surface, and wherein a normal direction with respect to the first surface defines a vertical direction;
   a power field effect transistor structure formed in the first region and having a first load terminal on the first surface of the semiconductor body and a second load terminal on the second surface of the semiconductor body;

a power diode formed in the second region and having a first load terminal on the first surface of the semiconductor body and a second load terminal on the second surface of the semiconductor body, the second load terminal of the power field effect transistor structure and the second load terminal of the power diode being formed by a common load terminal; and at least one edge termination structure adjacent to the first surface of the semiconductor body and in a horizontal direction between the first load terminal of the power field effect transistor structure and the first load terminal of the power diode.

2. The power semiconductor component of claim 1, wherein the power diode has a vertical pn junction.

3. The power semiconductor component of claim 1, wherein the at least one edge termination structure comprises a first field plate connected to the first load terminal of the power field effect transistor structure, a second field plate connected to the common load terminal, and a third field plate connected to the first load terminal of the power diode.

4. The power semiconductor component of claim 3, wherein the second field plate is arranged in the horizontal direction between the first field plate and the third field plate.

5. The power semiconductor component of claim 3, wherein the first field plate, the second field plate and the third field plate are separated from the semiconductor body by one or more dielectric zones.

6. The power semiconductor component of claim 1, wherein the power field effect transistor structure comprises an integrated freewheeling diode.

7. The power semiconductor component of claim 1, wherein the power field effect transistor structure comprises:
a first semiconductor zone of a first conductivity type;
a second semiconductor zone of a second conductivity type, the second semiconductor zone forming a first pn junction with the first semiconductor zone and being in ohmic contact with the first load terminal; and
a third semiconductor zone of the first conductivity type, the third semiconductor zone forming a second pn junction with the second semiconductor zone and being in ohmic contact with the first load terminal,
wherein the power diode comprises a semiconductor zone of the first conductivity type in ohmic contact with the first load terminal of the power diode.

8. The power semiconductor component of claim 7, further comprising a fourth semiconductor zone of the second conductivity zone in ohmic contact with the common terminal, the fourth semiconductor zone extending at least in the second region to the second surface of the semiconductor body.

9. The power semiconductor component of claim 8, further comprising a fifth semiconductor zone of the second conductivity type extending from the first surface of the semiconductor body to the fourth semiconductor zone and arranged in the horizontal direction between the first load terminal of the power field effect transistor structure and the first load terminal of the power diode.

10. The power semiconductor component of claim 8, further comprising an insulating zone extending from the first surface of the semiconductor body to at least near the fourth semiconductor zone and arranged in the horizontal direction between the first load terminal of the power field effect transistor structure and the first load terminal of the power diode.

11. The power semiconductor component of claim 1, further comprising at least one further edge termination structure adjacent to the first surface of the semiconductor body and in the horizontal direction not between the first load terminal of the power field effect transistor structure and the first load terminal of the power diode.

12. A chopper circuit for driving a load, the chopper circuit comprising:
a first voltage terminal;
a second voltage terminal;
a terminal for the load; and
a monolithically integrated power semiconductor component comprising:
a semiconductor body having a first region and a second region, the first region and the second region each extending from a first surface of the semiconductor body to a second surface of the semiconductor body, the second surface being opposite the first surface, and wherein a normal direction with respect to the first surface defines a vertical direction;
a power field effect transistor structure formed in the first region and having a first load terminal on the first surface of the semiconductor body and a second load terminal on the second surface of the semiconductor body;
a power diode formed in the second region and having a first load terminal on the first surface of the semiconductor body and a second load terminal on the second surface of the semiconductor body, the second load terminal of the power field effect transistor structure and the second load terminal of the power diode being formed by a common load terminal; and
at least one edge termination structure adjacent to the first surface of the semiconductor body and in a horizontal direction between the first load terminal of the power field effect transistor structure and the first load terminal of the power diode,
wherein the terminal for the load is connected to the common load terminal with low impedance, the first voltage terminal is connected to the first load terminal of the power field effect transistor structure with low impedance, and the second voltage terminal is connected to the first load terminal of the power diode with low impedance.

13. The chopper circuit of claim 12, further comprising:
a terminal for a further load; and
a further monolithically integrated power semiconductor component comprising:
a semiconductor body having a first region and a second region, the first region and the second region each extending from a first surface of the semiconductor body to a second surface of the semiconductor body, the second surface being opposite the first surface, and wherein a normal direction with respect to the first surface defines a vertical direction;
a power field effect transistor structure formed in the first region and having a first load terminal on the first surface of the semiconductor body and a second load terminal on the second surface of the semiconductor body;
a power diode formed in the second region and having a first load terminal on the first surface of the semiconductor body and a second load terminal on the second surface of the semiconductor body, the second load terminal of the power field effect transistor structure and the second load terminal of the power diode being formed by a common load terminal; and
at least one edge termination structure adjacent to the first surface of the semiconductor body and in a horizontal direction between the first load terminal of the power field effect transistor structure and the first load terminal of the power diode, wherein the terminal for the further load is connected to the common load terminal of the further monolithically integrated power semiconductor component, the first voltage terminal is connected to the first load terminal of the power field effect transistor structure of the further monolithically integrated power semiconductor component with low impedance, and the second voltage terminal is connected to the first load terminal of the power diode of the further monolithically integrated power semiconductor component.

14. The chopper circuit of claim 12, wherein the at least one edge termination structure comprises a first field plate connected to the first load terminal of the power field effect transistor structure, a second field plate connected to the common load terminal, and a third field plate connected to the first load terminal of the power diode.

15. A chopper circuit for driving a load, the chopper comprising:
- a first voltage terminal;
- a second voltage terminal;
- a terminal for the load; and
- at least one integrated power semiconductor component, comprising:
  - a common load terminal connected to the terminal for the load with low impedance;
  - a vertical diode structure comprising an anode zone adjoining the common load terminal and a cathode terminal connected to the second voltage terminal with low impedance; and
  - a vertical transistor structure comprising a first doped zone adjoining the common load terminal and a second doped zone connected to the first voltage terminal with low impedance.

16. The chopper circuit of claim 15, wherein the vertical transistor structure is a vertical MOSFET structure, the first doped zone is a drain zone adjoining the common load terminal, and the second doped zone is a source zone connected to the first voltage terminal with low impedance.

17. The chopper circuit of claim 15, wherein the vertical transistor structure is a vertical IGBT structure, the first doped zone is a collector zone adjoining the common load terminal, and the second doped zone is an emitter zone connected to the first voltage terminal with low impedance.

18. The chopper circuit of claim 17, wherein the vertical IGBT structure comprises an integrated freewheeling diode.

19. The chopper circuit of claim 15, wherein the at least one integrated semiconductor power component further comprises an edge termination structure arranged between the vertical diode structure and the vertical transistor structure.

20. The chopper circuit of claim 19, wherein the at least one edge termination structure comprises a first field plate connected to the first voltage terminal, a second field plate connected to the second voltage terminal, and a third field plate connected to the common load terminal.

* * * * *